United States Patent [19]

Wilson

[11] Patent Number: 5,041,416

[45] Date of Patent: Aug. 20, 1991

[54] SUPERCONDUCTIVE METAL MATRIX COMPOSITES AND METHOD FOR MAKING SAME

[75] Inventor: Charles N. Wilson, Maple Grove, Minn.

[73] Assignee: FMC Corporation, Chicago, Ill.

[21] Appl. No.: 598,566

[22] Filed: Oct. 16, 1990

Related U.S. Application Data

[62] Division of Ser. No. 258,533, Oct. 17, 1988, abandoned.

[51] Int. Cl.$^5$ ...................... C22C 29/12; H01L 39/12
[52] U.S. Cl. ......................................... 505/1; 252/518; 252/521; 264/60; 264/61; 419/19; 419/20; 419/21; 419/22; 419/25; 419/48; 501/123; 501/153; 505/742; 505/785
[58] Field of Search .................. 505/1, 785, 742; 75/232, 234, 235; 419/19, 20, 21, 22, 48, 25; 252/521, 518; 501/123, 153; 264/60, 61

[56] References Cited

U.S. PATENT DOCUMENTS

| | | | |
|---|---|---|---|
| 3,796,553 | 3/1974 | Daunt | 174/126 |
| 4,000,014 | 12/1976 | Winter et al. | 148/11.5 R |
| 4,050,147 | 9/1977 | Winter et al. | 29/599 |
| 4,411,959 | 10/1983 | Braginski et al. | 428/558 |
| 4,826,808 | 5/1989 | Yurek et al. | 252/514 |
| 4,892,861 | 1/1990 | Ray | 505/785 |

FOREIGN PATENT DOCUMENTS

| | | | |
|---|---|---|---|
| 0292126 | 4/1988 | European Pat. Off. | 505/1 |
| 8901706 | 6/1988 | World Int. Prop. O. | 505/1 |

OTHER PUBLICATIONS

Jin, "High Tc Superconductors-Composite Wire Fabrication", *Appl. Phys. Lett.* 51 (3), Jul. 20, 1987, pp. 203–204.
Garland, "A Novel Metal Matrix-High $T_c$ Superconducting Composite", *Advanced Cer. Mat.*, Special Issue, vol. 2 (3B), Jul. 1987, pp. 319–321.
Sherwood, "Superconducting Properties of $YBa_2Cu_3O$ Doped ... ", *Mat. Res. Soc. Symp. Proc.*, vol. 99, Nov. 1987, pp. 503–506.
Saito, "Composition Dependence of Superconductivity in Y-Ba-(AgCu)-O", *Jap. Jnl. Appl. Phys.*, vol. 26 (5), May 1987, pp. L832–L833.
Jin, "Superconductivity in the Bi-Sr-Ca-Cu-O Compounds with Noble Metal Additions", *Appl. Phys. Lett.*, vol. 52 (19), May 9, 1988, pp. 1628–1630.
McCallum, "Problems in the Production of $YBa_2Cu_3O_x$ Supercond. Wire", *Adv. Cer. Mat'l.*, vol. 2 (3B), Special Issue, Jul. 1987, pp. 388–400.
Malik, "Texture Formation and Enhanced Critical Currents in $YBa_2Cu_3O_x$", *Appl. Phys. Lett.*, vol. 52 (18), May 2, 1988, pp. 1525–1527.
Murr, "Shock Compression Fabrication of High-Temperature Superconductor", *Nature*, vol. 329, Sep. 3, 1987, pp. 37–39.
Goyal, "Cermets of the $Y_1Ba_2Cu_3O_{7-\delta}$ Superconductors", *Materials Letters*, vol. 6 (8,9), May 1988, pp. 257–260.

*Primary Examiner*—Paul Lieberman
*Assistant Examiner*—John Boyd
*Attorney, Agent, or Firm*—J. Preston Oxenham; Richard B. Megley

[57] ABSTRACT

A superconductor metal matrix composite formable into an electrical current carrying material. A superconductive particulate is intermixed with a normal metal matrix, pressed into form and heated to form the composite. The metal matrix surrounds the superconductive particulate to prevent loss of oxygen from the superconductive particulate so the particulate retains its superconductive properties. The metal matrix also becomes superconductive due to proximity effect.

6 Claims, 1 Drawing Sheet

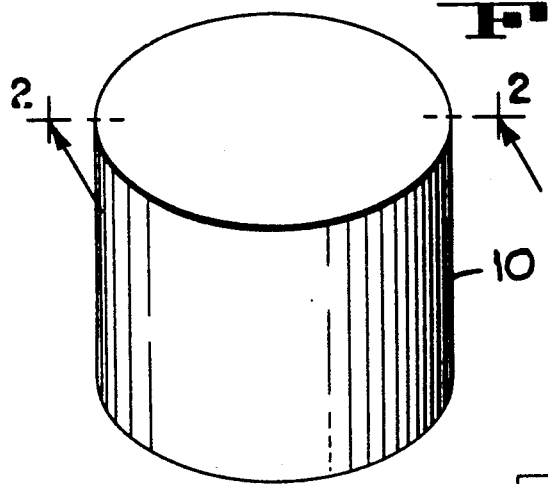
FIG_1
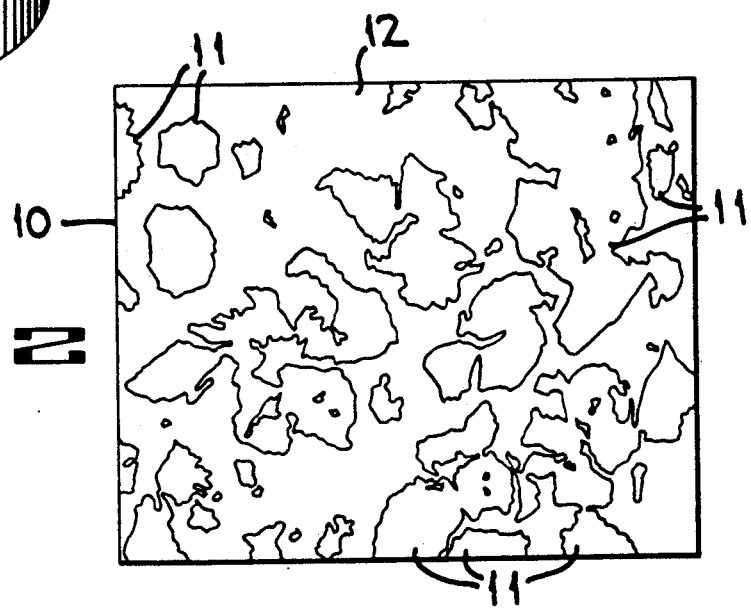
FIG_2
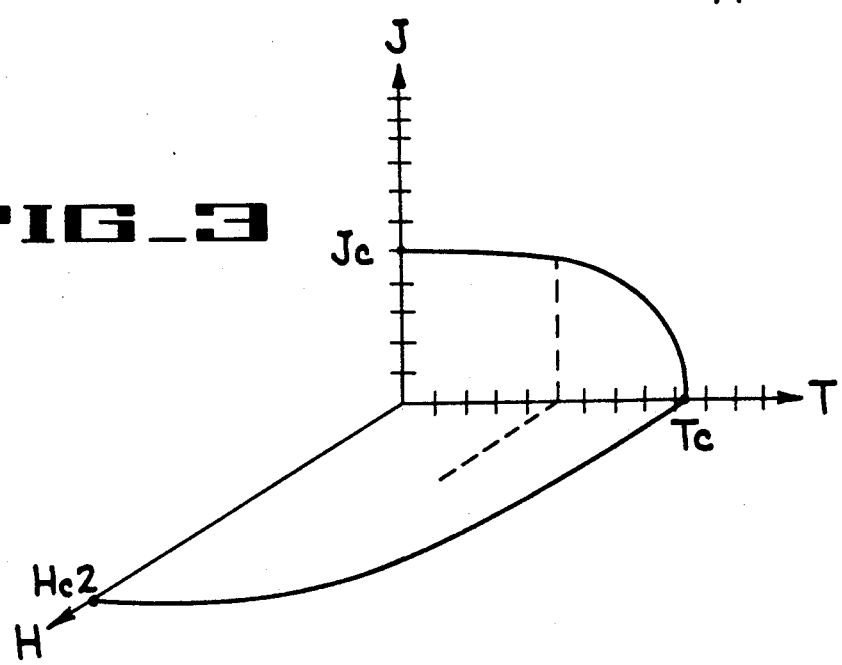
FIG_3

SUPERCONDUCTIVE METAL MATRIX COMPOSITES AND METHOD FOR MAKING SAME

This application is a division of application Ser. No. 07/258,533 filed Oct. 17, 1988 now abandoned.

BACKGROUND OF THE INVENTION

The present invention pertains to superconductors and more particularly, to superconductor metal matrix composites and methods of making the same.

Recent discoveries of ceramic oxide superconductive materials has significantly raised the critical temperature of superconductors and decreased the cost of the coolant material needed to cool the superconductors below the critical temperature. A disadvantage of the various ceramic oxide materials is that they are brittle and breakable when fire hardened which limits the forms in which they can be shaped after firing. Also, if superconductivity is lost because of a rise in temperature or for other reasons a ceramic superconductor could lose conductivity and cause damage to other elements in the associated electrical circuit.

SUMMARY OF THE INVENTION

The present invention discloses a superconductive metal matrix composite which includes a metal particulate having a superconductive particulate dispersed throughout the metal particulate. Heat and pressure are applied to the mixture to densify the matrix of the composite. The dispersion of superconductive particulate in the metal matrix causes the metal to also become superconductive due to a proximity effect. The metal matrix encapsulates the superconductive particulate which inhibits degradation of the superconductive particulate which can result because of chemical reactions between the superconductive particulate and the external environment. The metal also provides a degree of conductivity for the composite if superconductivity should be lost due to a rise in temperature or for other reasons.

BRIEF DESCRIPTION OF THE DRAWINGS

FIG. 1 is a perspective of an electrical conductor which includes a superconductive composite of the present invention.

FIG. 2 is a cross-sectional view taken along line 2—2 of FIG. 1.

FIG. 3 is a graph showing the superconducting regime of the superconductive composite of the present invention as related to temperature, current density and applied magnetic field.

DESCRIPTION OF THE PREFERRED EMBODIMENT

A conductor 10 which can be formed from superconductive metal matrix composites of the present invention is disclosed in FIG. 1. The conductor 10 is formed by using a superconductive ceramic material, such as yttrium-barium-copper oxide, finely ground to form a superconductive particulate. A metal particulate, such as silver, a silver alloy or silver oxide is mixed with the superconductive particulate so a plurality of superconductive particles 11 (FIG. 2) are dispersed throughout a metal particulate 12. The mixture is placed under pressure and heated to incorporate the superconductive particulate in a dense continuous metal matrix. The resulting composite can be formed into superconductive wires and coils for high field magnets used in numerous power generation and transmission devices.

When conductor 10 is cooled below a critical temperature Tc (FIG. 3) the superconductive particulate has a sharp drop in the resistance to electrical current flow. Due to the well-known proximity effect the resistance of the metal particulate also drops sharply so the entire composite is superconductive below temperature Tc.

In addition to forming ductile wires and becoming a superconductive material, due to proximity effect, the metal 12 of FIG. 2 also provides an electrical current path through conductor 10 if the ceramic material should lose its superconductive properties. This current path could prevent damage of electrical elements in a circuit if the ceramic material is no longer superconductive. The metal 12 (FIG. 2) also provides better thermal dissipation than the ceramic portion and may prevent the conductor temperature from rising above the critical value. The metal matrix also provides faster switching from a superconductive condition to a non-superconductive condition of conductor 10 (FIG. 1).

As seen in FIG. 3, there are three critical parameters of the superconductive material which determine if the material is a superconductor. First, the temperature of the material must be lower than a critical temperature Tc. Second, the magnetic field in which the material resides must be less than a critical value Hc2. Third, the current density in the conductor must be less than a critical value Jc.

A problem with processing ceramic superconductive material is that heat can cause oxygen from the superconductive particulate to be lost, which, in turn causes the ceramic material to lose its superconductive properties. In the present invention the metal particles 12 (FIG. 2) surrounding the ceramic particles 11 are formed into a dense continuous matrix by the application of heat and pressure such that the temperature of the ceramic particles does not exceed a level which results in a significant loss of oxygen.

The following is one example of a composite which can be used as a superconductor: The composite can be made by first mixing superconductive yttrium-barium-cuprate powder of −45 to +80 mesh with pure silver powder of 2.4 TO 4.0 micron particle size. The mixture is uniaxially cold dry pressed at about 41,000 psi in a half-inch diameter steel die. The die is then preloaded to about 5,100 psi prior to initiating the hot pressing cycle. The material is hot pressed by heating the die to 385 degrees C. in about 10 minutes and holding the temperature at 385 degrees C. for an additional 40 minutes. During the heat-up portion of the cycle the applied pressure is allowed to rise from 5,100 to 6,900 psi. During the 40 minute soak portion of the cycle the pressure is allowed to decrease from 6,900 psi to 5,000 psi. After the 40 minute soak at 385 degrees C., the die and material are rapidly cooled to room temperature. A variety of other materials can also be used to form a composite.

Thus, mixing a metal particulate with a ceramic superconductive particulate provides a stronger, more ductile material which can be made into the form of a wire conductor. The metal particulate also becomes superconductive due to the proximity effect, and provides an electrical current path through the wire conductor if the ceramic material should become non-superconductive.

Although the best mode contemplated for carrying out the present invention has been herein shown and described, it will be apparent that modification and variation may be made without departing from what is regarded to be the subject matter of the invention.

What is claimed is:

1. A process of forming a superconductive metal matrix composite including the steps of:
   preparing a superconductive ceramic material into a particulate;
   adding a powdered metal material to said particulate;
   mixing said superconductive particulate with said metal material;
   uniaxially cold dry pressing the mixture in a die followed by hot pressing to a pressure of about 5,100 psi;
   heating said die to about 385 C. in about ten minutes while the pressure in said die is allowed to rise to about 6,900 psi;
   holding that temperature for a period of about 40 minutes followed by rapid cooling to room temperature.

2. A process of forming a composite as defined in claim 1 wherein said superconductive material comprises a ceramic material and wherein said metal material includes silver.

3. A method of forming a superconductive metal matrix composite including the steps of:
   preparing a superconductive material into a particulate;
   adding a powdered metal material to said particulate;
   mixing said superconductive particulate with said powered metal material;
   uniaxially cold dry pressing said mixture to a preload of about 5,100 psi;
   heating the material to 385° centigrade over an interval of about 10 minutes;
   raising the applied pressure from about 5,100 psi to 6,900 psi over said 10 minute interval;
   maintaining said mixture at a temperature of 385° centigrade for 40 minutes; and,
   rapidly cooling said mixture to room temperature.

4. The method of claim 3, in which said superconductive material is prepared in to a particulate of between 31 45 to +80 mesh.

5. The method of claim 3, in which said powered metal material is silver powder of between 2.4 and 4.0 micron particle size.

6. The method of claim 5, in which said superconductive particulate is yttrium-barium-cuprate powder.

UNITED STATES PATENT AND TRADEMARK OFFICE
CERTIFICATE OF CORRECTION

PATENT NO. : 5,041,416

DATED : August 20, 1991

INVENTOR(S) : Charles N. Wilson

It is certified that error appears in the above-identified patent and that said Letters Patent is hereby corrected as shown below:

Column 4, line 19, change "31 45" to -- -45--.

Signed and Sealed this

Twentieth Day of April, 1993

Attest:

MICHAEL K. KIRK

Attesting Officer

Acting Commissioner of Patents and Trademarks